(12) United States Patent
Shindo et al.

(10) Patent No.: US 9,805,960 B2
(45) Date of Patent: Oct. 31, 2017

(54) SUBSTRATE CONVEYANCE METHOD

(71) Applicant: TOKYO ELECTRON LIMITED, Tokyo (JP)

(72) Inventors: Takehiro Shindo, Miyagi (JP); Tadashi Shioneri, Miyagi (JP); Masahiro Dogome, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/202,658

(22) Filed: Jul. 6, 2016

(65) Prior Publication Data
US 2017/0011940 A1 Jan. 12, 2017

(30) Foreign Application Priority Data

Jul. 7, 2015 (JP) .................................. 2015-136210

(51) Int. Cl.
*H01L 21/67* (2006.01)
*H01L 21/677* (2006.01)
*H01L 21/68* (2006.01)

(52) U.S. Cl.
CPC .. *H01L 21/67259* (2013.01); *H01L 21/67167* (2013.01); *H01L 21/67196* (2013.01); *H01L 21/67739* (2013.01); *H01L 21/67742* (2013.01); *H01L 21/68* (2013.01)

(58) Field of Classification Search
CPC ..................... H01L 21/67259; H01L 21/67739
See application file for complete search history.

(56) References Cited

U.S. PATENT DOCUMENTS

| | | | | |
|---|---|---|---|---|
| 5,917,601 A * | 6/1999 | Shimazaki | ............. | G01D 5/342 356/400 |
| 6,339,730 B1 * | 1/2002 | Matsushima | ..... | H01L 21/67167 318/568.16 |
| 6,522,942 B2 * | 2/2003 | Kondo | .............. | H01L 21/67259 318/568.16 |
| 6,760,976 B1 * | 7/2004 | Martinson | ......... | H01L 21/67265 33/520 |

(Continued)

FOREIGN PATENT DOCUMENTS

| | | |
|---|---|---|
| JP | 2007-211317 A | 8/2007 |
| WO | 2014/077379 A1 | 5/2014 |

*Primary Examiner* — Thomas Randazzo
(74) *Attorney, Agent, or Firm* — Rothwell, Figg, Ernst & Manbeck, P.C.

(57) ABSTRACT

When an edge of a wafer passes above a right sensor and a left sensor disposed in a conveyance route of the wafer to a substrate processing chamber, four edge intersecting points are acquired in a first wafer coordinate system, and a reference edge intersecting point set composed of two adjacent edge intersecting points is created from the four edge intersecting points. Between the two remaining edge intersecting points which do not constitute the reference edge intersecting point set, an edge intersecting point present within an area surrounded by two circles defined based on the two edge intersecting points constituting the reference edge intersecting point set is selected as an effective edge intersecting point, and a central position of a circle passing through the reference edge intersecting points and the effective edge intersecting point is acquired as a central position of the wafer.

7 Claims, 14 Drawing Sheets

(56) References Cited

U.S. PATENT DOCUMENTS

| | | | |
|---|---|---|---|
| 6,845,292 B2 * | 1/2005 | Sha | H01L 21/67259 |
| | | | 414/936 |
| 8,025,475 B2 * | 9/2011 | Wakabayashi | H01L 21/67748 |
| | | | 414/744.5 |
| 8,253,948 B2 * | 8/2012 | Kiley | B65G 25/02 |
| | | | 250/234 |
| 8,395,136 B2 * | 3/2013 | Kondoh | H01L 21/67742 |
| | | | 250/221 |
| 8,634,633 B2 * | 1/2014 | Kiley | H01L 21/681 |
| | | | 382/141 |
| 2015/0303083 A1 | 10/2015 | Wakabayashi | |

* cited by examiner

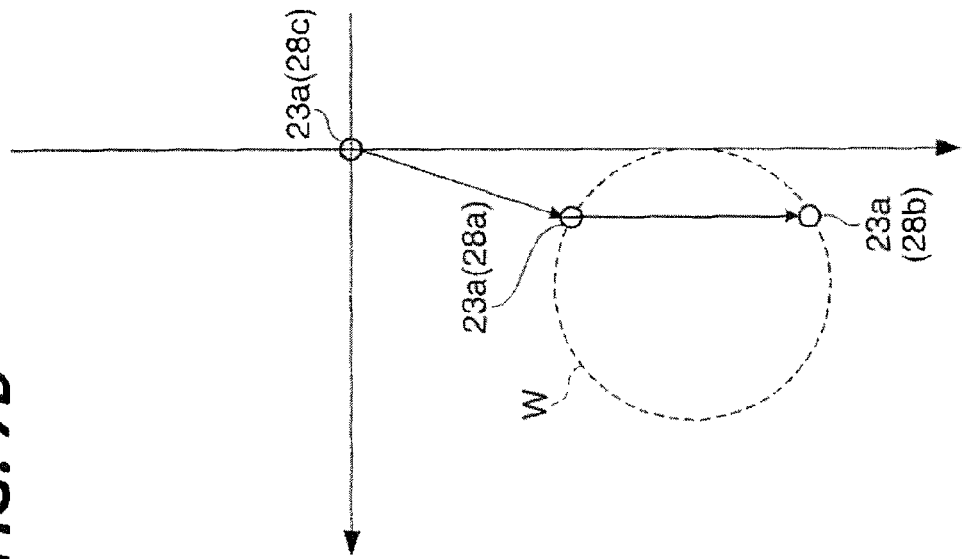
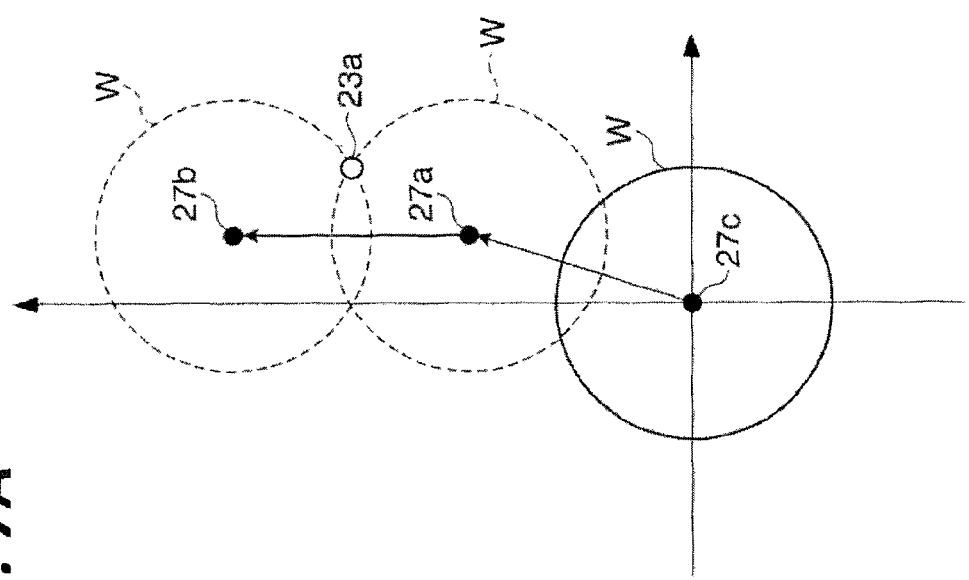

SUBSTRATE CONVEYANCE METHOD

CROSS-REFERENCE TO RELATED APPLICATIONS

This application is based on and claims priority from Japanese Patent Application No. 2015-136210, filed on Jul. 7, 2015, with the Japan Patent Office, the disclosure of which is incorporated herein in its entirety by reference.

TECHNICAL FIELD

The present disclosure relates to a substrate conveyance method, a program, and a substrate processing apparatus, and particularly to a substrate conveyance method, a program for correcting a deviation of a substrate, and a substrate processing apparatus.

BACKGROUND

Generally, as illustrated in FIG. 14, a substrate processing apparatus includes a substrate conveyance chamber 141 equipped therein with a conveyance robot 140 configured to convey a disk-shaped semiconductor wafer W (hereinafter, simply referred to as a "wafer") as a substrate, and a plurality of substrate processing chambers 142 arranged radially around the substrate conveyance chamber 141. In such a substrate processing apparatus, the conveyance robot 140 carries a wafer W into or from each of the substrate processing chambers 142.

Meanwhile, the wafer W is placed on a placing table 143 disposed within each of the substrate processing chambers 142. When, for example, a plasma etching processing is performed on the wafer W, it is required to exactly place the wafer W at a predetermined position on the placing table 143. Therefore, in a substrate processing apparatus, position sensors 144 for acquiring a position of the wafer W are disposed within the substrate conveyance chamber 141. Then, the wafer W is conveyed to the position sensors 144 by the conveyance robot 140, and the position of the wafer W is acquired (see, for example, Japanese Patent Laid-Open Publication No. 2007-211317). Then, when the wafer W is carried into a substrate processing chamber 142, the position of the wafer W is corrected based on the acquired position of the wafer W.

SUMMARY

The present disclosure provides a method for conveying a disk-shaped substrate to a substrate processing chamber by a conveyance unit. The method includes: acquiring, in advance, a reference substrate position as a reference of a position of the substrate when the substrate is conveyed; acquiring a conveyance substrate position which is a position of the substrate conveyed to the substrate processing chamber; calculating a positional deviation of the conveyance substrate position with respect to the reference substrate position; and correcting a pathway of the substrate to the substrate processing chamber to eliminate the calculated positional deviation. The acquiring of the conveyance substrate position includes: disposing two position sensors in a conveyance route of the substrate such that the two position sensors are spaced apart from each other at an interval smaller than a diameter of the substrate, and face the substrate; acquiring four intersecting points where the two position sensors intersect with an outer edge of the substrate; selecting two intersecting points among the four intersecting points as reference intersecting points; defining two circles passing through the two reference intersecting points and having different diameters; and selecting an intersecting point present within an area surrounded by the two circles, between two intersecting points unselected as the reference intersecting points from the four intersecting points, and acquiring the conveyance substrate position based on the selected intersecting points and the two reference intersecting points.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 7A and 7B are views for explaining a relative movement of a wafer and a position sensor in a second exemplary embodiment of the present disclosure. FIG. 7A illustrates a movement of the wafer in a conveyance robot coordinate system, and FIG. 7B illustrates a movement of the position sensor in a wafer coordinate system.

FIG. 10A illustrates a movement of the wafer in a conveyance robot coordinate system, and FIG. 10B illustrates a movement of the position sensor in a wafer coordinate system.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Figure 14:
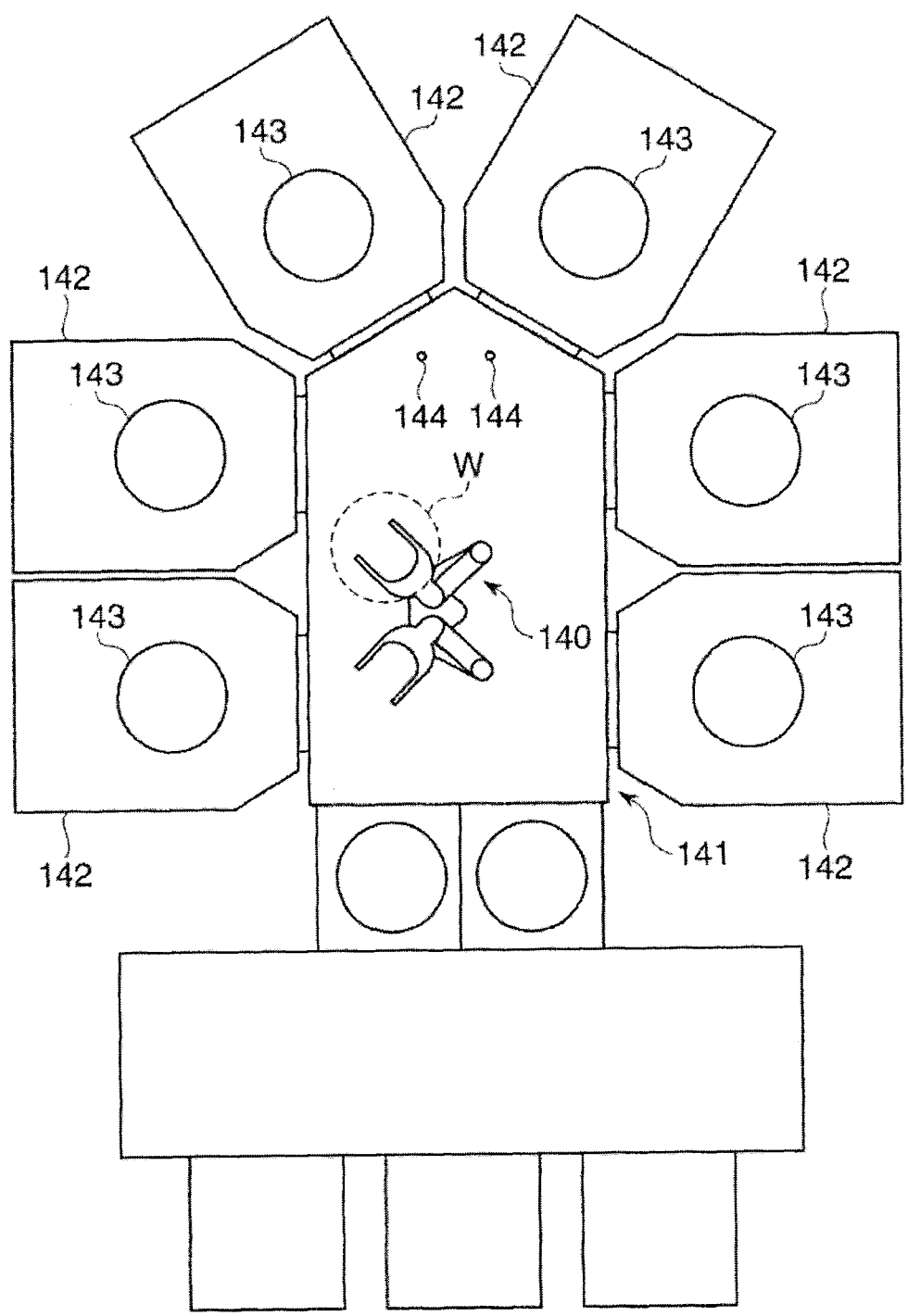
FIG. 14 is a plan view schematically illustrating a configuration of a plasma processing apparatus as a conventional substrate processing apparatus.

As illustrated in FIG. 14, the position sensors 144 are disposed at a position away from each substrate processing chamber 142 and thus, a predetermined time is required until a wafer W is moved to the substrate processing chamber 142 after the position of the wafer W is acquired by the position sensors 144. As a result, there is a problem in that the throughput is reduced. Also, a conveyance route in which the wafer W is moved from the position sensors 144 to the substrate processing chamber 142 is prolonged, and a pathway of the wafer W in the conveyance route is largely changed. Thus, there is a problem in that the position of the wafer W is further deviated during conveyance after the position of the wafer W is acquired by the position sensors 144.

An object of the present disclosure is to provide a substrate conveyance method, a program, and a substrate processing apparatus by which a substrate conveyance throughput may be improved, and an occurrence of a further deviation of a substrate may be suppressed.

In order to achieve the object, according to the present disclosure, a method for conveying a disk-shaped substrate to a substrate processing chamber by a conveyance unit includes: acquiring, in advance, a reference substrate position as a reference of a position of the substrate when the substrate is conveyed; acquiring a conveyance substrate position which is a position of the substrate conveyed to the substrate processing chamber; calculating a positional deviation of the conveyance substrate position with respect to the reference substrate position; and correcting a pathway of the substrate to the substrate processing chamber to eliminate the calculated positional deviation. The acquiring of the conveyance substrate position includes: disposing two position sensors in a conveyance route of the substrate such that the two position sensors are spaced apart from each other at an interval smaller than a diameter of the substrate, and face the substrate; acquiring four intersecting points where the two position sensors intersect with an outer edge of the substrate; selecting two intersecting points among the four intersecting points as reference intersecting points; defining two circles passing through the two reference intersecting points and having different diameters; and selecting an intersecting point present within an area surrounded by the two circles, between two intersecting points unselected as the reference intersecting points from the four intersecting points, and acquiring the conveyance substrate position based on the selected intersecting points and the two reference intersecting points.

In order to achieve the object, according to the present disclosure, a method for conveying a disk-shaped substrate to a substrate processing chamber by a conveyance unit includes: acquiring, in advance, a reference substrate position as a reference of a position of the substrate when the substrate is conveyed; acquiring a conveyance substrate position which is a position of the substrate conveyed to the substrate processing chamber; calculating a positional deviation of the conveyance substrate position with respect to the reference substrate position; and correcting a pathway of the substrate to the substrate processing chamber to eliminate the calculated positional deviation. The acquiring of the conveyance substrate position includes: disposing two position sensors in a conveyance route of the substrate such that the two position sensors are spaced apart from each other at an interval smaller than a diameter of the substrate, and face the conveyed substrate; acquiring four intersecting points where the two position sensors intersect with an outer edge of the substrate; creating a plurality of combinations of intersecting points, each combination being composed of three intersecting points, from the four intersecting points; defining circles each of which passes through the three intersecting points in each of the combinations; and acquiring the conveyance substrate position based on a circle having a diameter most close to the diameter of the conveyed substrate among the defined circles.

In order to achieve the object, according to the present disclosure, a method for conveying a disk-shaped substrate to a substrate processing chamber by a conveyance unit includes: acquiring, in advance, a reference substrate position as a reference of a position of the substrate when the substrate is conveyed; acquiring a conveyance substrate position which is a position of the substrate conveyed to the substrate processing chamber; calculating a positional deviation of the conveyance substrate position with respect to the reference substrate position; and correcting a pathway of the substrate to the substrate processing chamber to eliminate the calculated positional deviation. The acquiring of the conveyance substrate position includes: disposing a position sensor in a conveyance route of the substrate such that the position sensor faces the conveyed substrate; acquiring two intersecting points where the position sensor intersects with an outer edge of the substrate; and geometrically acquiring the conveyance substrate position based on the two intersecting points and a radius of the conveyed substrate.

In the substrate conveyance method, the acquiring of the conveyance substrate position includes: disposing a different position sensor in the conveyance route of the substrate such that the position sensor faces the conveyed substrate; acquiring two other intersecting points where the position sensor intersects with the outer edge of the substrate; geometrically acquiring a different conveyance substrate position which is a position of the substrate conveyed to the substrate processing chamber based on the two other intersecting points and the radius of the conveyed substrate; calculating an average substrate position by averaging the conveyance substrate position and the different conveyance substrate position; and calculating a positional deviation of the average substrate position with respect to the reference substrate position.

In the substrate conveyance method, the acquiring of the conveyance substrate position, the calculating of the positional deviation, and the correcting of the pathway of the substrate are performed when the substrate is conveyed.

In the substrate conveyance method, the acquiring of the conveyance substrate position, the calculating of the positional deviation, and the correcting of the pathway of the substrate are performed at a time when aged deterioration of the conveyance unit is expected.

In the substrate conveyance method, at a time when the position sensors are exchanged, the acquiring of the conveyance substrate position, the calculating of the positional deviation, and the correcting of the pathway of the substrate are performed.

A substrate processing apparatus according to the present disclosure is provided with a substrate processing chamber and a conveyance unit configured to convey a disk-shaped substrate to the substrate processing chamber. The substrate processing apparatus includes: a controller; and two position sensors disposed in a conveyance route of the substrate such that the two position sensors are spaced apart from each other at an interval smaller than a diameter of the substrate, and face the conveyed substrate. The controller is configured to acquire, in advance, a reference substrate position as a reference of a position of the substrate when the substrate is conveyed; acquire a conveyance substrate position which is a position of the substrate conveyed to the substrate processing chamber; calculate a positional deviation of the conveyance substrate position with respect to the reference substrate position; and correct a pathway of the substrate to the substrate processing chamber to eliminate the calculated positional deviation. When acquiring the conveyance substrate position, the controller acquires four intersecting points where the two position sensors intersect with an outer edge of the substrate; selects two intersecting points among the four intersecting points as reference intersecting points; defines two circles passing through the two reference intersecting points and having different diameters; and selects an intersecting point present within an area surrounded by the two circles, between two intersecting points unselected as the reference intersecting points from the four intersecting points, and acquires the conveyance substrate position based on the selected intersecting points and the two reference intersecting points.

A substrate processing apparatus according to the present disclosure is provided with a substrate processing chamber and a conveyance unit configured to convey a disk-shaped substrate to the substrate processing chamber. The substrate processing apparatus includes: a controller; and two position sensors disposed in a conveyance route of the substrate such that the two position sensors are spaced apart from each other at an interval smaller than a diameter of the substrate, and face the conveyed substrate. The controller is configured to acquire, in advance, a reference substrate position as a reference of a position of the substrate when the substrate is conveyed; acquire a conveyance substrate position which is a position of the substrate conveyed to the substrate processing chamber; calculate a positional deviation of the conveyance substrate position with respect to the reference substrate position; and correct a pathway of the substrate to the substrate processing chamber to eliminate the calculated positional deviation. When acquiring the conveyance substrate position, the controller acquires four intersecting points where the two position sensors intersect with an outer edge of the substrate; creates a plurality of combinations of intersecting points, each combination being composed of three intersecting points, from the four intersecting points; defines circles each of which passes through the three intersecting points in each of the combinations; and acquires the conveyance substrate position based on a circle having a diameter most close to the diameter of the conveyed substrate among the defined circles.

A substrate processing apparatus according to the present disclosure is provided with a substrate processing chamber and a conveyance unit configured to convey a disk-shaped substrate to the substrate processing chamber. The substrate processing apparatus includes: a controller; and a position sensor disposed in a conveyance route of the substrate such that the position sensor faces the conveyed substrate. The controller is configured to acquire, in advance, a reference substrate position as a reference of a position of the substrate when the substrate is conveyed; acquire a conveyance substrate position which is a position of the substrate conveyed to the substrate processing chamber; calculate a positional deviation of the conveyance substrate position with respect to the reference substrate position; and correct a pathway of the substrate to the substrate processing chamber to eliminate the calculated positional deviation. When acquiring the conveyance substrate position, the controller acquires two intersecting points where the position sensor intersects with an outer edge of the substrate; and geometrically acquires the conveyance substrate position based on the two intersecting points and a radius of the conveyed substrate.

According to the present disclosure, a substrate conveyance throughput may be improved and a further deviation of a substrate may be suppressed from occurring.

Hereinafter, exemplary embodiments of the present disclosure will be described in detail with reference to drawings.

First, a first exemplary embodiment of the present disclosure will be described.

Figure 1:
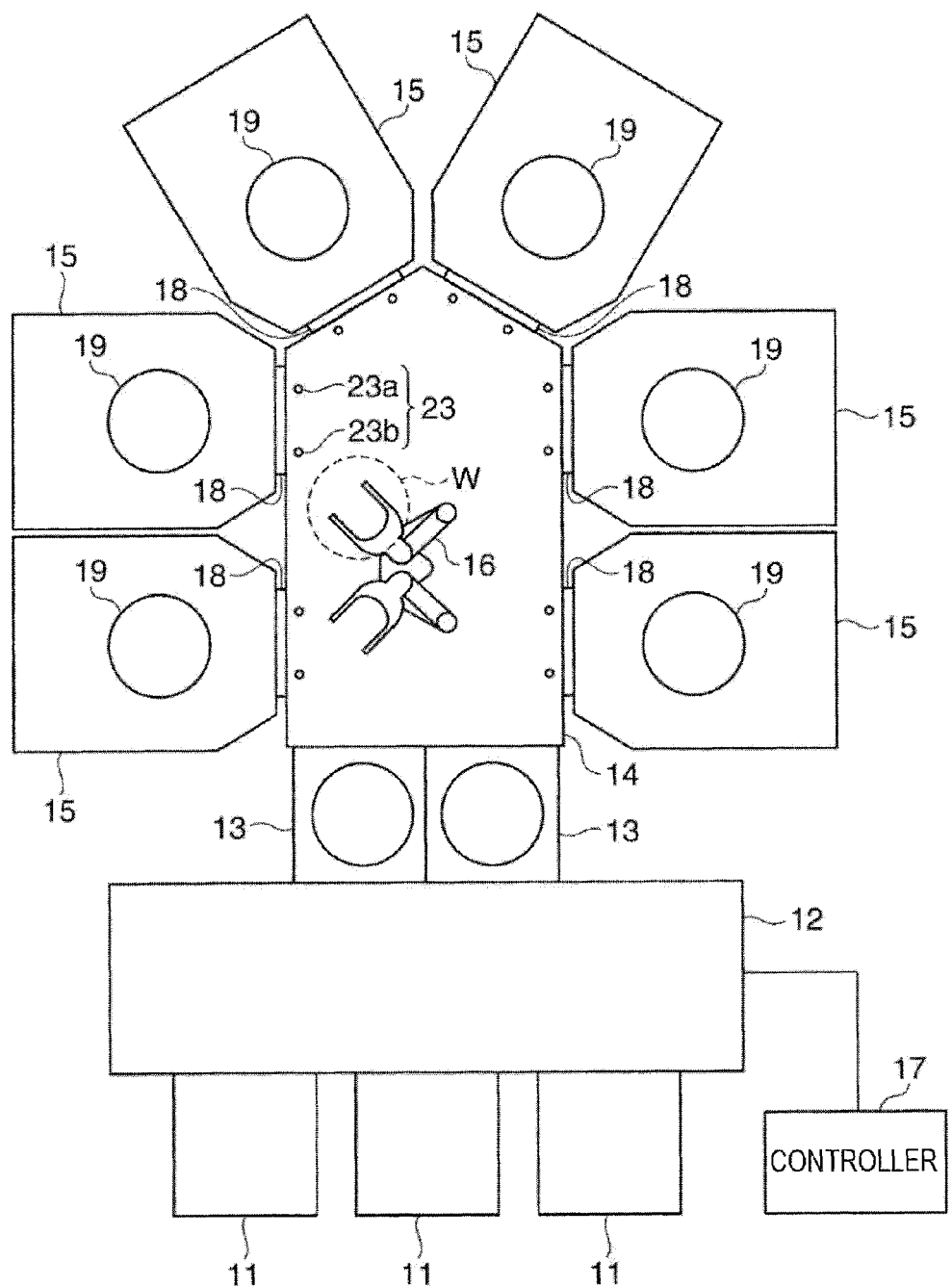
FIG. 1 is a plan view schematically illustrating a configuration of a plasma processing apparatus as a substrate processing apparatus according to a first exemplary embodiment of the present disclosure.

FIG. 1 is a plan view schematically illustrating a configuration of a plasma processing apparatus as a substrate processing apparatus according to the present exemplary embodiment.

In FIG. 1, a plasma processing apparatus 10 includes three load ports 11 provided to place FOUPs (not illustrated) thereon. Each FOUP is a carrier that accommodates, for example, a predetermined number of wafers W with a diameter of φ300 mm.

In the plasma processing apparatus 10, a loader chamber 12 is disposed adjacent to the load ports 11 to carry wafers W into or from the FOUPs. The inside of the loader chamber 12 is always placed at atmospheric pressure, and a conveyance robot (not illustrated) for conveying the wafers W is disposed within the loader chamber 12.

At the opposite side to the load ports 11 across the loader chamber 12, two load lock chambers 13 are disposed as substrate delivery chambers. The loader chamber 12 conveys the wafers W between the FOUPs placed on the load ports 11 and the load lock chambers 13. The inside of each of the load lock chambers 13 is configured to be selectively switchable between a vacuum atmosphere and an atmospheric pressure atmosphere. The inside of each load lock chamber 13 becomes an atmospheric pressure atmosphere when communicating with the loader chamber 12, and becomes a vacuum atmosphere when communicating with a substrate conveyance chamber 14 to be described below. The load lock chambers 13 serve as intermediate conveyance chambers for conveying the wafers W between the loader chamber 12 and the substrate conveyance chamber 14.

At the opposite side to the loader chamber 12 across the load lock chambers 13, the substrate conveyance chamber 14 having, for example, a pentagonal shape in a plan view is disposed. Six substrate processing chambers 15 are disposed radially around the substrate conveyance chamber 14 to be connected to the substrate conveyance chamber 14. Within the substrate conveyance chamber 14, a predetermined vacuum degree is always maintained, and a conveyance robot 16 for conveying the wafers W is disposed. The conveyance robot 16 conveys wafers W between the respective substrate processing chambers 15 or between the substrate processing chambers 15 and the load lock chambers 13.

Further, the plasma processing apparatus 10 includes a controller 17 to control the operations of respective components of the plasma processing apparatus 10. The controller 17 has, for example, a CPU or a memory, and the CPU executes a substrate conveyance method as described below according to a program stored in, for example, the memory.

In the plasma processing apparatus 10, each of the substrate processing chambers 15 and the substrate conveyance chamber 14 are connected to each other through a gate valve 18, and the gate valve 18 controls the communication between each substrate processing chamber 15 and the substrate conveyance chamber 14. The inside of each substrate processing chamber 15 is maintained in vacuum at a predetermined vacuum degree. A wafer W is placed on a placing table 19 disposed within the substrate processing chamber 15, and a predetermined plasma processing (e.g., a plasma etching processing) is performed on the wafer W.

Figure 2:
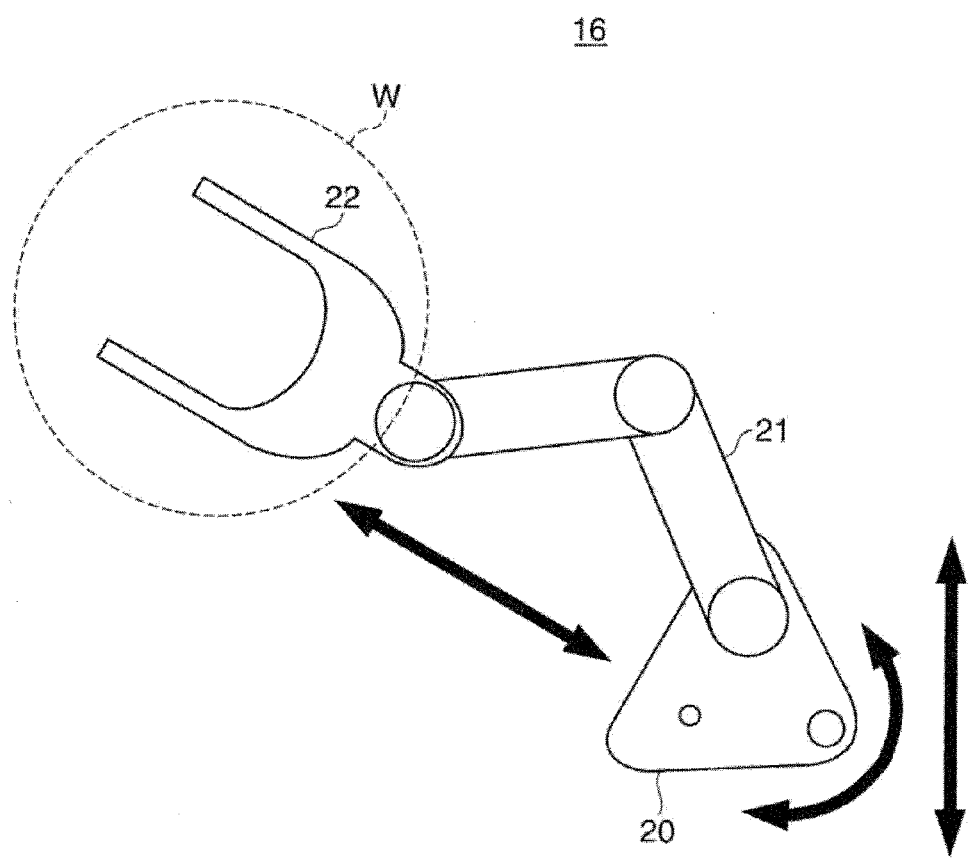
FIG. 2 is a plan view schematically illustrating a configuration of a conveyance robot in FIG. 1.

FIG. 2 is a plan view schematically illustrating a configuration of a conveyance robot in FIG. 1.

In FIG. 2, the conveyance robot 16 includes a pedestal 20 configured to be rotatable within a horizontal plane, and having a substantially triangular shape in a plan view, an articulated arm 21 configured to be retractable in the horizontal direction with respect to the pedestal 20, and a fork 22 attached to a distal end of the articulated arm 21 and configured to place a wafer W thereon. The fork 22 has a substantially U shape in a plan view. The pedestal 20 is also configured to be movable in the horizontal direction, specifically, in the up-and-down direction of FIG. 1. The conveyance robot 16 is equipped therein with three motors (not illustrated). The three motors are configured to execute the rotation and movement of the pedestal 20 and the extension and retraction of the articulated arm 21, respectively. By the rotation and movement of the pedestal 20 and the extension and retraction of the articulated arm 21, the wafer W placed on the fork 22 is conveyed to a desired place.

When, for example, a plasma etching processing is performed on the wafer W in the substrate processing chamber 15, it is required to exactly place the wafer W at a predetermined position on the placing table 19. However, the position of the wafer W is adjusted by an alignment chamber (not illustrated) associated with the loader chamber 12. Thus, when the wafer W is conveyed from the loader chamber 12 to the substrate processing chamber 15 through the load lock chamber 13, the position of the wafer W, for example, the central position of the wafer W, may be deviated from a desired position, for example, the centroid position of the fork 22 due to, for example, an inertia moment acting on the wafer W. Thus, when the wafer W is conveyed, it is required to calculate the deviation of the wafer W from a desired position (hereinafter, simply referred to as a "positional deviation"), and correct the position of the wafer W to eliminate the calculated positional deviation.

Concerning the elimination of the positional deviation, the placing table 19 does not have a function of correcting the position of the wafer W, and thus, it is required to correct the position of the wafer W by the conveyance robot 16 when the conveyance robot 16 conveys the wafer W. Specifically, since it is required to correct the conveyance route of the wafer W by the conveyance robot 16, the conveyance route of the wafer W is corrected after the positional deviation of the wafer W is calculated as described below in the present exemplary embodiment. Concerning the calculation of the positional deviation, since it is required to measure (acquire) the position of the wafer W to be conveyed to the substrate processing chamber 15, a pair of sensors 23 composed of two position sensors are disposed in front of each substrate processing chamber 15 within the substrate conveyance chamber 14, more specifically so as to face each gate valve 18, as illustrated in FIG. 1, in the present exemplary embodiment. Hereinafter, in one pair of sensors 23, a position sensor at the right side in a direction toward the substrate processing chamber 15 is referred to as a right sensor 23a, and a position sensor at the left side in the direction toward the substrate processing chamber 15 is referred to as a left sensor 23b.

In each pair of sensors 23, the right sensor 23a and the left sensor 23b are spaced apart from each other at an interval smaller than the diameter of the wafer W, and are disposed to face the back surface of the wafer W conveyed by the conveyance robot 16. Each of the right sensor 23a and the left sensor 23b detects a passage of an outer edge (hereinafter, simply referred to as an "edge") of the wafer W at the upper side thereof. The controller 17 calculates a position of the conveyance robot 16 of the wafer W when the edge of the wafer W has passed above the right sensor 23a or the left sensor 23b, specifically, the centroid position of the fork 22, from encoder values of the three motors of the conveyance robot 16.

Figure 3A:
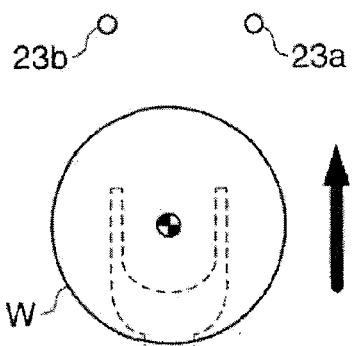
FIGS. 3A to 3E are views for explaining a passage detection timing of an edge of a wafer by a pair of sensors in FIG. 1.
Figure 3B:
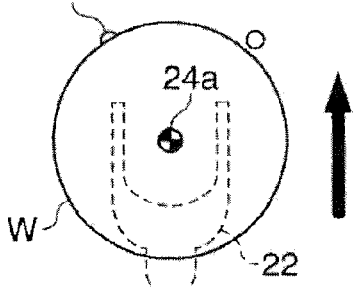
Figure 3C:
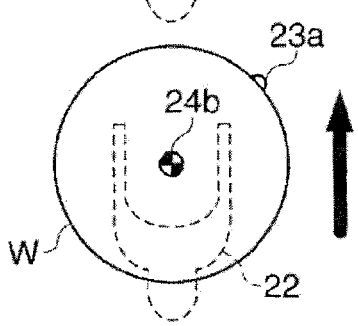
Figure 3D:
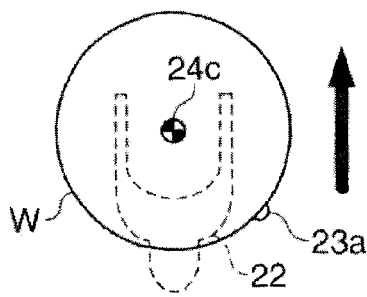
Figure 3E:
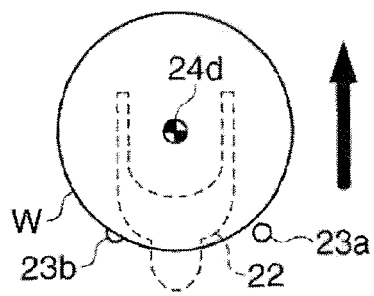
Figure 4:
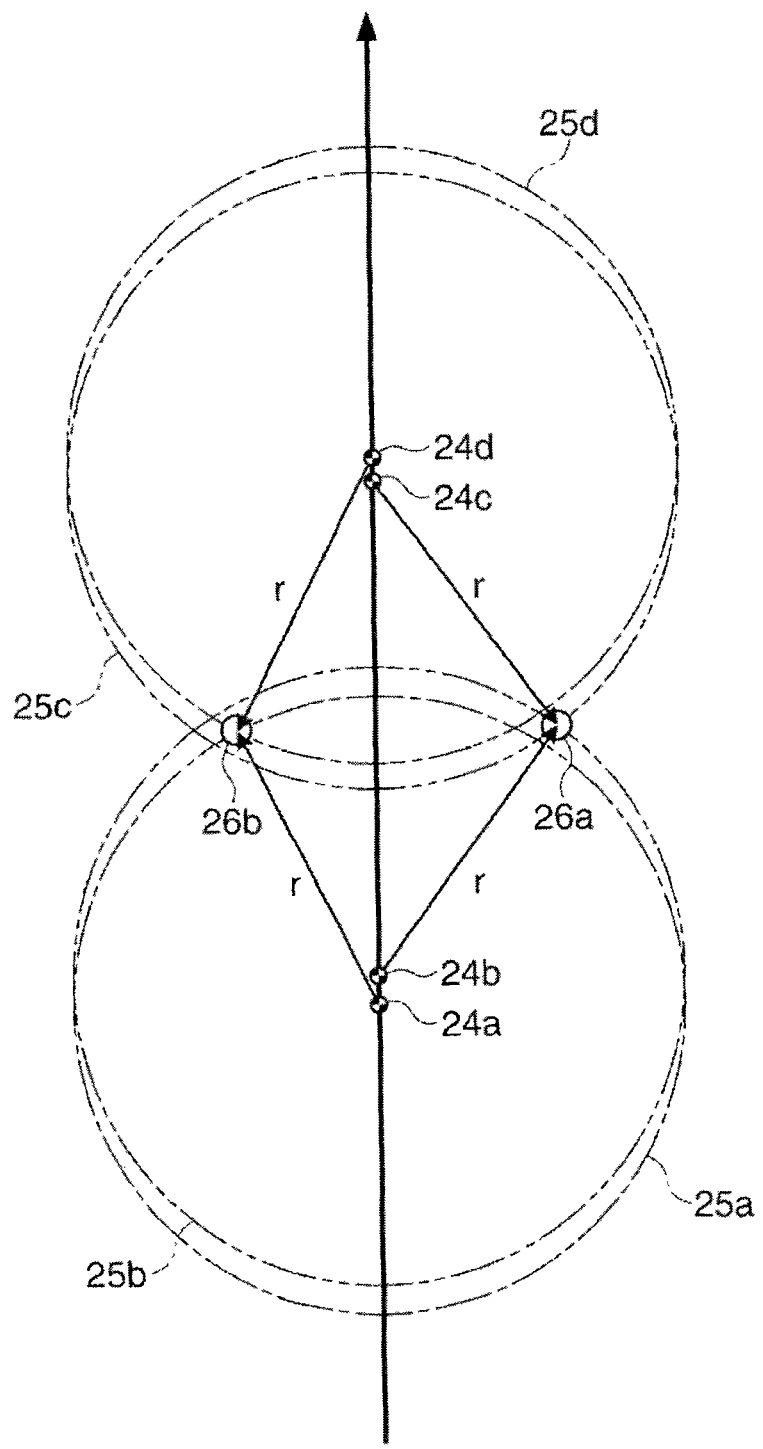
FIG. 4 is a view for explaining a method of acquiring a position of a right sensor and a position of a left sensor in the present exemplary embodiment.

FIGS. 3A to 3E are views for explaining a passage detection timing of an edge of a wafer by a pair of sensors in FIG. 1, and FIG. 4 is a view for explaining a method of acquiring a position of a right sensor and a position of a left sensor in the present exemplary embodiment.

In FIGS. 3A to 3E, when the pair of sensors 23 are offset to the right side with respect to the conveying direction of the wafer W (an arrow in the drawing), first, the left edge of the wafer W passes above the left sensor 23b, and here, a centroid position 24a of the fork 22 is calculated (FIG. 3B). Then, the right edge of the wafer W passes above the right sensor 23a, and here, a centroid position 24b of the fork 22 is calculated (FIG. 3C). Then, the right edge of the wafer W passes above the right sensor 23a, and here, a centroid position 24c of the fork 22 is calculated (FIG. 3D). Then, the left edge of the wafer W passes above the left sensor 23b, and here, a centroid position 24d of the fork 22 is calculated (FIG. 3E). That is, when the wafer W passes above the pair of sensors 23, the four centroid positions 24a to 24d of the fork 22 are calculated.

Then, in FIG. 4, the four calculated centroid positions of the fork 22 are plotted in a coordinate system indicating the movement of the centroid position of the fork 22 of the conveyance robot 16 (hereinafter, referred to as a "conveyance robot coordinate system"). First, two circles 25a and 25d (indicated by one-dot chain line in the drawing) with the same radius r as that of the wafer W are drawn around the centroid positions 24a and 24d of the fork 22 when the left sensor 23b has passed the left edge of the wafer W, and an intersecting point of the two circles 25a and 25d is acquired as a position 26b of the left sensor 23b in the conveyance robot coordinate system. Also, two circles 25b and 25c (indicated by two-dot chain line in the drawing) with the same radius r as that of the wafer W are drawn around the centroid positions 24b and 24c of the fork 22 when the right sensor 23a has passed the right edge of the wafer W, and an intersecting point of the two circles 25b and 25c is acquired as a position 26a of the right sensor 23a in the conveyance robot coordinate system.

Figure 5:
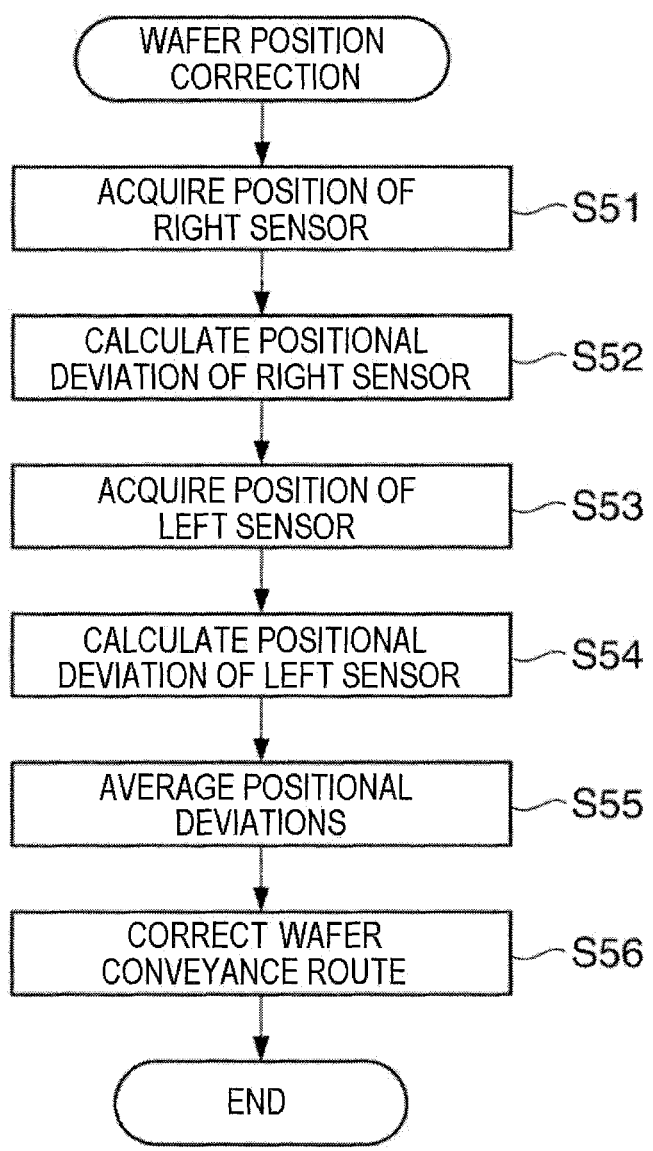
FIG. 5 is a flow chart illustrating a wafer position correction processing in a substrate conveyance method according to the present exemplary embodiment.

FIG. 5 is a flow chart illustrating a wafer position correction processing in a substrate conveyance method according to the present exemplary embodiment.

In the present exemplary embodiment, the processing of FIG. 5 is performed whenever the conveyance robot 16 conveys the wafer W to the substrate processing chamber 15. However, the processing of FIG. 5 is carried out on the assumption that the position of the right sensor 23a and the position of the left sensor 23b in the conveyance robot coordinate system have been acquired as a reference right sensor position and a reference left sensor position, respectively, in advance. As a method of acquiring the reference right sensor position and the reference left sensor position, the acquisition method of FIG. 4 as described above may be used.

First, when a wafer W is conveyed by the conveyance robot 16 and passes above the pair of sensors 23, the centroid positions 24a to 24d of the fork 22 are calculated as described above. First, using the acquisition method of FIG. 4, the position 26a of the right sensor 23a is acquired from the centroid positions 24b and 24c (step S51).

Then, a difference (positional deviation) between the reference right sensor position (a previously acquired position of the right sensor 23a in the conveyance robot coordinate system) and the position 26a of the right sensor 23a s calculated (step S52). Here, the position 26a of the right sensor 23a depends on the position where the right sensor 23a and the right edge of the wafer W intersect, and the intersecting position depends on the position of the conveyed wafer W. Accordingly, since the position of the conveyed wafer W is reflected on the position 26a of the right sensor 23a, the positional deviation between the reference right sensor position and the position 26a of the right sensor 23a corresponds to the positional deviation of the wafer W. Therefore, in the present exemplary embodiment, the positional deviation between the reference right sensor position and the position 26a of the right sensor 23a (the positional deviation of the position 26a detected by the right sensor 23a, with respect to the reference right sensor position) is considered as the positional deviation of the wafer W.

Then, using the acquisition method of FIG. 4, the position 26b of the left sensor 23b is acquired from the centroid positions 24a and 24d (step S53). Then, a difference (positional deviation) between the reference left sensor position (a previously acquired position of the left sensor 23b in the conveyance robot coordinate system) and the position 26b of the left sensor 23b is calculated (step S54). Since the position of the conveyed wafer W is reflected on the position 26b of the left sensor 23b, the positional deviation between the reference left sensor position and the position 26b of the left sensor 23 b is considered as a positional deviation of the wafer W (the positional deviation of the position 26b detected by the left sensor 23b, with respect to the reference left sensor position) in the present exemplary embodiment.

Then, the positional deviation of the position 26a detected by the right sensor 23a, with respect to the reference right sensor position, and the positional deviation of the position 26b detected by the left sensor 23b, with respect to the reference left sensor position are averaged (step S55), and the averaged positional deviation is acquired as a positional deviation ($\delta$) of the wafer W to be used for correcting the position of the wafer W. Hereinafter, the positional deviation ($\delta$) will be referred to as a "positional deviation for correction ($\delta$)."

Figure 6:
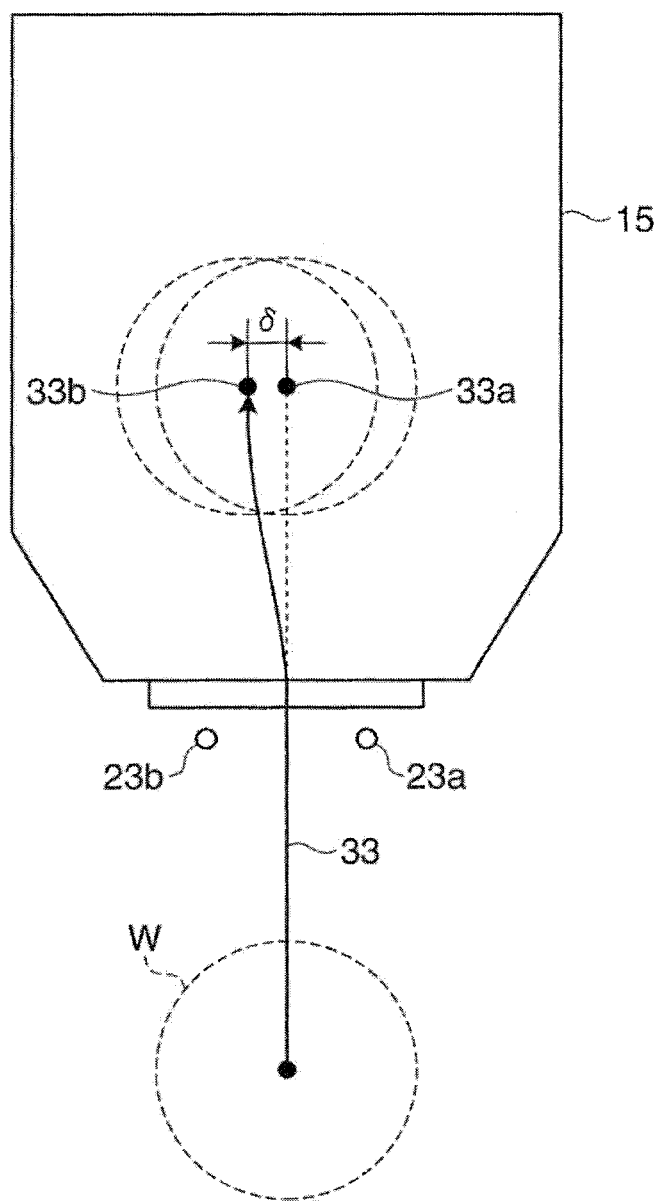
FIG. 6 is a view for explaining a method of correcting a conveyance route of a wafer in the present exemplary embodiment.

Then, based on the acquired positional deviation for correction ($\delta$), the conveyance route of the wafer W is corrected (step S56). Specifically, as illustrated in FIG. 6, the conveyance route of the wafer W is corrected such that the wafer W is conveyed toward a corrected target position 33b which is offset from an initial target position 33a by the positional deviation for correction ($\delta$) in the conveyance route 33 of the wafer W. The correction of the conveyance route of the wafer W is performed until the wafer W reaches the corrected target position 33b after the wafer W passes above the pair of sensors 23 and the positional deviation ($\delta$) of the wafer W is acquired, and is performed over a lot of time to gradually change a force applied to the wafer W.

Then, after the wafer W is conveyed to the corrected target position 33b, the processing is finished.

According to the processing of FIG. 5, in the conveyance route of the wafer W toward the substrate processing chamber 15, the two right and left sensors 23a and 23b are spaced apart from each other at an interval smaller than the diameter of the wafer W, and are disposed to face the conveyed wafer W. When the right edge or the left edge of the wafer W passes above the two right and left sensors 23a and 23b, the four centroid positions 24a to 24d of the fork 22 are calculated. Based on the centroid positions 24a to 24d, the position 26a of the right sensor 23a and the position 26b of the left sensor 23b in the conveyance robot coordinate system are acquired, and based on the acquired position 26a of the right sensor 23a and the acquired position 26b of the left sensor 23b, the positional deviation for correction ($\delta$) is acquired.

That is, when the wafer W is conveyed to the substrate processing chamber 15, the positional deviation for correction ($\delta$) is acquired using the two right and left sensors 23a and 23b disposed on the conveyance route of the wafer W. Thus, in order to acquire the positional deviation for correction ($\delta$), it is possible to eliminate the need to use a position sensor disposed at a position away from the substrate processing chamber 15. Thus, a predetermined time is not required until the wafer W is moved to the substrate processing chamber 15 after the positional deviation of the wafer W is acquired.

When the positional deviation for correction ($\delta$) is acquired using the two right and left sensors 23a and 23 b disposed on the conveyance route of the wafer W, the conveyance route of the wafer W to the substrate processing chamber 15 is corrected to eliminate the positional deviation for correction ($\delta$). That is, since the conveyance route of the wafer W is corrected after the wafer W passes above the two right and left sensors 23a and 23b, a pathway of the wafer W in the conveyance route is not largely changed as compared to a case where the wafer W is moved to the substrate processing chamber 15 from the position sensor disposed at a position away from the substrate processing chamber 15. Also, the correction of the conveyance route of the wafer W is performed for a predetermined correction time after the wafer W passes above the pair of sensors 23 and the positional deviation for correction ($\delta$) is acquired. Then, regardless of the magnitude of the positional deviation for correction ($\delta$), the conveyance route of the wafer W is corrected spending all of the correction time. Thus, it is possible to reduce the correction amount of the conveyance route per unit time, thereby suppressing the pathway of the wafer W in the conveyance route from being largely changed.

As described above, the conveyance throughput of the wafer W may be improved and a further deviation of the wafer W may be suppressed from occurring during the conveyance of the wafer W.

Also, in the processing of FIG. 5, when the positional deviation for correction ($\delta$) is acquired, the positional deviation between the reference right sensor position and the position 26a of the right sensor 23a, and the positional deviation between the reference left sensor position and the position 26b of the left sensor 23b are averaged. Accordingly, the reliability of the positional deviation for correction ($\delta$) may be improved, and further, the correction reliability of the conveyance route of the wafer W may be improved.

Also, the two right and left sensors 23a and 23b may substantially detect whether the wafer W is placed on the fork 22 by detecting the passage of the edge of the wafer W. Thus, it is possible to eliminate the need to provide a sensor for detecting whether the wafer W is present in addition to the two right and left sensors 23a and 23b.

The processing of FIG. 5 is performed whenever the conveyance robot 16 conveys the wafer W to the substrate processing chamber 15, and thus, it is possible to exactly place each conveyed wafer W at a predetermined position on the placing table 19 of the substrate processing chamber 15 to exactly perform a plasma etching processing on each portion of each wafer W.

In the present exemplary embodiment, the positional deviation for correction (δ) is acquired using the two right and left sensors 23a and 23b when the wafer W is conveyed toward the substrate processing chamber 15. Meanwhile, the positional deviation for correction (δ) may be acquired using the two right and left sensors 23a and 23b when the wafer W is carried out of the substrate processing chamber 15. In this case, the conveyance route of the wafer W to be conveyed next time is corrected using the acquired positional deviation for correction (δ).

Also, the positional deviation of the wafer W may be caused by not only the inertia moment acting on the wafer W, but also the aged deterioration of the conveyance robot 16, specifically, secular elongation of a driving belt embedded in the articulated arm 21. However, when the processing of FIG. 5 is performed at a time when the aged deterioration of the conveyance robot 16 is expected, the positional deviation of the wafer W caused by the aged deterioration of the conveyance robot 16 may be eliminated. Thus, even though the conveyance robot 16 is deteriorated with age, the wafer W may be exactly placed at a predetermined position on the placing table 19 of the substrate processing chamber 15.

In a case where the pair of sensors 23 are replaced, when, for example, the position of the wafer W at the same position in the conveyance robot coordinate system is acquired, the position of the wafer W acquired using the replacement pair of sensors 23 may be deviated from the position of the wafer W acquired using the existing pair of sensors 23 due to a difference of measurement errors of the pair of sensors 23 before and after the replacement. In this case, when the processing of FIG. 5 is performed after the replacement of the pair of sensors 23, the positional deviation for correction (δ) on the measurement result of the replacement pair of sensors 23 may be acquired.

Then, when the measurement is performed using the replacement pair of sensors 23, the conveyance route of the wafer W may be corrected using the positional deviation for correction (δ), thereby eliminating the difference of measurement errors of the pair of sensors 23 before and after the replacement. Accordingly, even though the pair of sensors 23 are replaced, it is possible to exactly place the wafer W at a predetermined position on the placing table 19 of the substrate processing chamber 15.

Hereinafter, a second exemplary embodiment of the present disclosure will be described.

The configurations and operations of the present exemplary embodiment are basically the same as those of the first exemplary embodiment as described above. Thus, descriptions on duplicate configurations and operations will be omitted, and only different configurations and operations will be described.

As illustrated in FIG. 7A, in a conveyance robot coordinate system, when the conveyance robot 16 conveys a wafer W, the wafer W is moved with respect to the right sensor 23a, and the right sensor 23a detects the passage of the right edge of the wafer W twice. Meanwhile, in a coordinate system that fixes the wafer W (hereinafter, referred to as a "wafer coordinate system"), as illustrated in FIG. 7B, the movement of the wafer W with respect to the right sensor 23a is converted into the movement of the right sensor 23a with respect to the wafer W, and the right sensor 23a detects intersection between the right sensor 23a and the right edge of the wafer W twice. The intersecting point between the right sensor 23a and the right edge of the wafer W (hereinafter, referred to as "an edge intersecting point") corresponds to a central position of the wafer W (hereinafter, referred to as an "edge passage detection point") when the passage of the right edge of the wafer W is detected in the conveyance robot coordinate system. Specifically, an edge passage detection point 27a when the passage of the right edge of the wafer W is firstly detected in the conveyance robot coordinate system corresponds to an edge intersecting point 28a firstly detected in the wafer coordinate system, and an edge passage detection point 27b when the passage of the right edge of the wafer W is secondly detected in the conveyance robot coordinate system corresponds to an edge intersecting point 28b secondly detected in the wafer coordinate system. Also, in the wafer coordinate system, since the movement of the wafer W with respect to the right sensor 23a in the conveyance robot coordinate system is converted into the movement of the right sensor 23a with respect to the wafer W, an inverse vector of a motion vector from an origin 27c to the edge passage detection points 27a and 27b in the conveyance robot coordinate system corresponds to a motion vector from an origin 28c to the edge intersecting points 28a and 28b in the wafer coordinate system.

Meanwhile, when the centroid position of the fork 22 is coincident with the central position of the wafer W, the coordinates of the edge passage detection points 27a and 27b in the conveyance robot coordinate system may be calculated from encoder values of three motors of the conveyance robot 16. Also, as described above, the motion vector from the origin to the edge intersecting points 28a and 28b in the wafer coordinate system may be calculated from the motion vector from the origin to the edge passage detection points 27a and 27b in the conveyance robot coordinate system. Accordingly, from the coordinates of the edge passage detection points 27a and 27b, the coordinates of the edge intersecting points 28a and 28b may be calculated in the wafer coordinate system. Therefore, in the present exemplary embodiment, from the coordinates of the edge intersecting points 28a and 28b in the wafer coordinate system, the central position of the wafer W is calculated.

Figure 8:
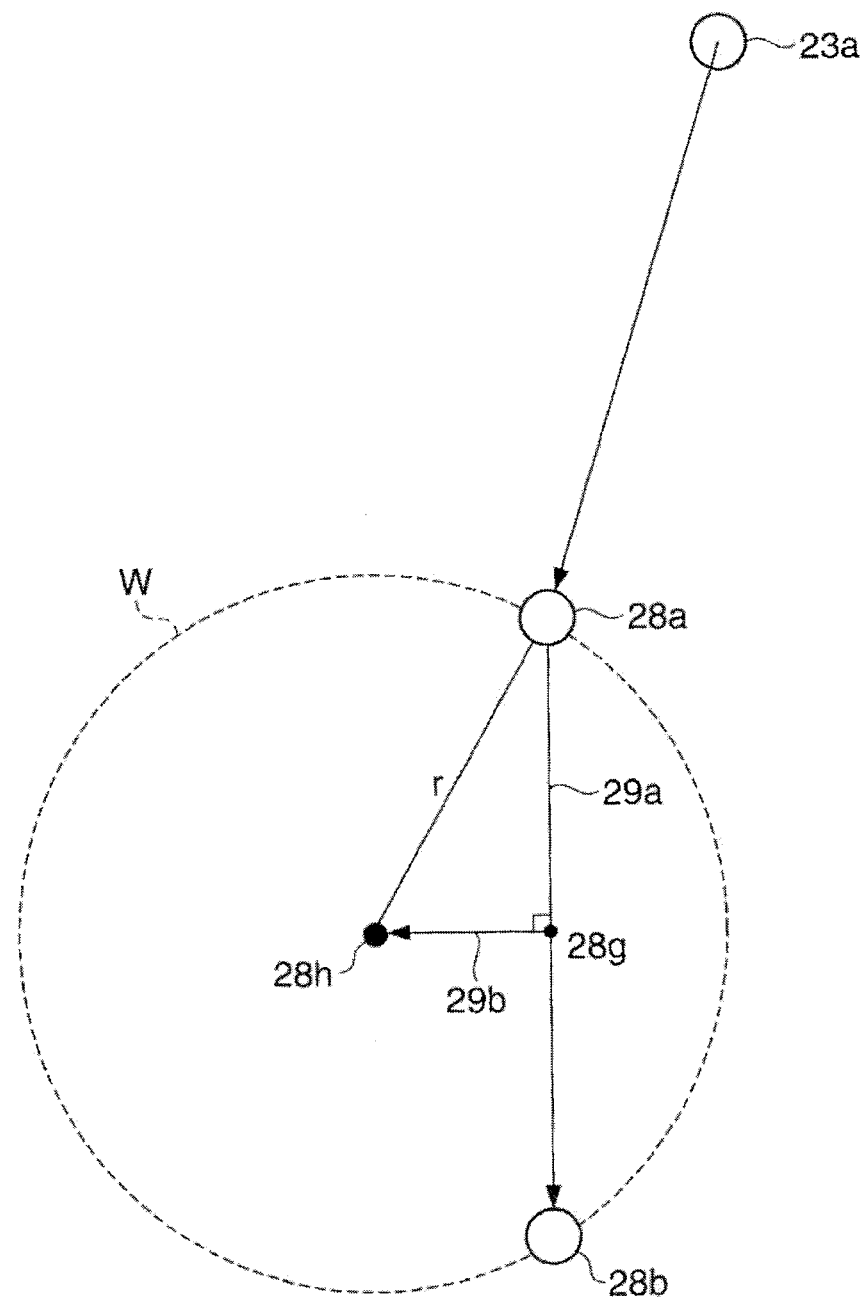
FIG. 8 is a view for explaining a method of acquiring a central position of a wafer in the present exemplary embodiment.

FIG. 8 is a view for explaining a method of acquiring a central position of a wafer in the present exemplary embodiment.

First, in the wafer coordinate system, coordinates of a midpoint 28g of the edge intersecting points 28a and 28b are calculated. Here, since both the edge intersecting points 28a and 28b are present on the edge of the wafer W, a central position 28h, the midpoint 28g and the edge intersecting point 28a (or 28b) of the wafer W constitutes a right-angled triangle in which the length of a hypotenuse is coincident with the radius r of the wafer W. Therefore, when the vector from the edge intersecting point 28a to the midpoint 28g is set as a vector 29a, and the vector to the central position 28h of the wafer W from the midpoint 28g is set as a vector 29b, the scalar quantity of the vector 29a may be calculated from the coordinates of the edge intersecting point 28a and the midpoint 28g. Thus, the scalar quantity of the vector 29b may be calculated from the Pythagorean theorem. Also, since the vector 29b is perpendicular to the vector 29a, the vector 29b may be calculated. Since the point moved from the midpoint 28g by the vector 29b becomes the central position 28h of the wafer W, the central position 28h of the wafer W is acquired from the calculated coordinates of the midpoint 28g and the vector 29b in the present exemplary embodiment.

In FIGS. 7A and 7B and FIG. 8, the wafer coordinate system is based on the right sensor 23a. However, there is a wafer coordinate system based on the left sensor 23b (another position sensor). Also, in such a wafer coordinate system as well, the coordinates of the central position of the wafer W may be calculated in the same acquisition method as that of FIG. 8. Hereinafter, in the present exemplary embodiment, in the wafer coordinate system based on the right sensor 23a (hereinafter, referred to as a "first wafer coordinate system"), the central position 28h of the wafer W is referred to as a "first wafer central position" (substrate position during conveyance), and in the wafer coordinate system based on the left sensor 23b (hereinafter, referred to as a "second wafer coordinate system"), the central position of the wafer W is referred to as a "second wafer central position" (another substrate position during conveyance).

Figure 9:
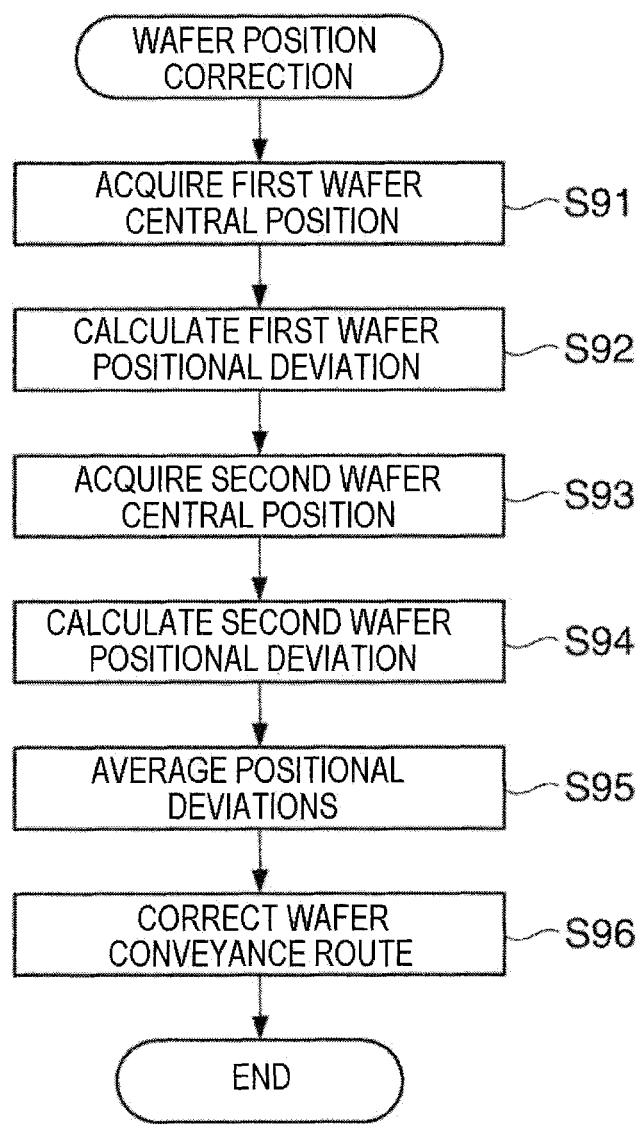
FIG. 9 is a flow chart illustrating a wafer position correction processing in a substrate conveyance method according to the present exemplary embodiment.

FIG. 9 is a flow chart illustrating a wafer position correction processing in a substrate conveyance method according to the present exemplary embodiment.

In the present exemplary embodiment as well, the processing of FIG. 9 is performed whenever the conveyance robot 16 conveys the wafer W to the substrate processing chamber 15. However, the processing of FIG. 9 is carried out on the assumption that the central positions of the wafer W in the first wafer coordinate system and the second wafer coordinate system have been acquired as a first reference wafer position (a reference substrate position) and a second reference wafer position (a reference substrate position), respectively, in advance. Also, as an acquisition method of the first reference wafer position, the acquisition method of FIG. 8 may be used, and as an acquisition method of the second reference wafer position, the same acquisition method as that of FIG. 8 may be used.

First, when a wafer W is conveyed by the conveyance robot 16 and passes above the pair of sensors 23, the edge intersecting points 28a and 28b in the first wafer coordinate system are acquired, and the first wafer central position is acquired according to the acquisition method of FIG. 8 (step S91). Then, a difference between the first reference wafer position and the first wafer central position (a first wafer positional deviation) is calculated (step S92).

Then, when the conveyed wafer W passes above the pair of sensors 23, the two edge intersecting points (other intersecting points) in the second wafer coordinate system are similarly acquired, and the second wafer central position is acquired according to the same acquisition method as that of FIG. 8 (step S93). Then, a difference between the second reference wafer position and the second wafer central position (a second wafer positional deviation) is calculated (step S94).

Then, the first wafer positional deviation and the second wafer positional deviation are averaged (step S95), and the averaged positional deviation is acquired as a positional deviation for correction (δ). Then, the conveyance route of the wafer W is corrected based on the acquired positional deviation for correction (δ) (step S96). Then, after the wafer W is conveyed to the corrected target position 33b, the processing is finished.

According to the processing of FIG. 9, when the edge of the wafer W passes above the right sensor 23a disposed on the conveyance route of the wafer W to the substrate processing chamber 15, the edge intersecting points 28a and 28b in the first wafer coordinate system are acquired, and the first wafer central position is geometrically acquired based on the edge intersecting points 28a and 28b and the radius r of the conveyed wafer W. Also, likewise, when the edge of the wafer W passes above the left sensor 23b disposed on the conveyance route of the wafer W to the substrate processing chamber 15, the two edge intersecting points in the second wafer coordinate system are acquired, and the second wafer central position is geometrically acquired based on the two edge intersecting points and the radius r of the conveyed wafer W. That is, when the wafer W is conveyed to the substrate processing chamber 15, since the first wafer central position and the second wafer central position are acquired using the two right and left sensors 23a and 23b disposed on the conveyance route of the wafer W, it is possible to eliminate the need to acquire a central position of the wafer W using a position sensor disposed at a position away from the substrate processing chamber 15. Thus, a predetermined time is not required until the wafer W is moved to the substrate processing chamber 15 after the first wafer central position or the second wafer central position is acquired.

As in the first exemplary embodiment, the conveyance route of the wafer W is corrected after the wafer W passes above the two right and left sensors 23a and 23b. The correction of the conveyance route of the wafer W is performed spending all of a predetermined correction time regardless of the magnitude of the positional deviation for correction (δ) after the wafer W passes above the pair of sensors 23 and the positional deviation for correction (δ) is acquired. Thus, as in the first exemplary embodiment, it is possible to reduce the correction amount of the conveyance route per unit time, thereby suppressing the pathway of the wafer W in the conveyance route from being largely changed.

Accordingly, the conveyance throughput of the wafer W may be improved and a further deviation of the wafer W may be suppressed from occurring during the conveyance of the wafer W.

Also, in the processing of FIG. 9, when the positional deviation for correction (δ) is acquired, the positional deviation for correction (δ) is acquired by averaging the first wafer positional deviation and the second wafer positional deviation. Accordingly, the reliability of the positional deviation for correction (δ) may be improved, and further, the correction reliability of the conveyance route of the wafer W may be improved. When the right sensor 23a or the left sensor 23b of the pair of sensors 23 is failed, only the first wafer central position or the second wafer central position may be acquired, and either a difference between the first reference wafer position and the first wafer central position, or a difference between the second reference wafer position and the second wafer central position may be acquired as the positional deviation for correction (δ). This accompanies teaching, thereby eliminating a need to immediately perform an exchange of the pair of sensors 23 which requires a predetermined maintenance time. In particular, when teaching is performed, a cover (not illustrated) of the substrate processing chamber 15 is opened and a wafer with a known diameter (hereinafter, referred to as a "teaching wafer") is directly placed on the placing table 19 of the substrate processing chamber 15 such that the teaching wafer is indirectly introduced to the substrate conveyance chamber 14. Here, the substrate processing chamber 15 is opened to the atmosphere. Thus, it may take time to perform internal cleaning and contamination check (confirmation of particles) of the substrate processing chamber 15 required for return to a state ready for wafer processing. Accordingly, when the exchange of the pair of sensors 23 is not immediately performed and the performing of the teaching is postponed, the execution of the internal cleaning and contamination check of the substrate processing chamber 15 may be avoided so that the efficiency for the wafer processing in the substrate processing chamber 15 may be improved.

Hereinafter, a third exemplary embodiment of the present disclosure will be described.

The configurations and operations of the present exemplary embodiment are also basically the same as those of the first exemplary embodiment as described above. Thus, descriptions on duplicate configurations and operations will be omitted, and only different configurations and operations will be described.

Figure 10B:
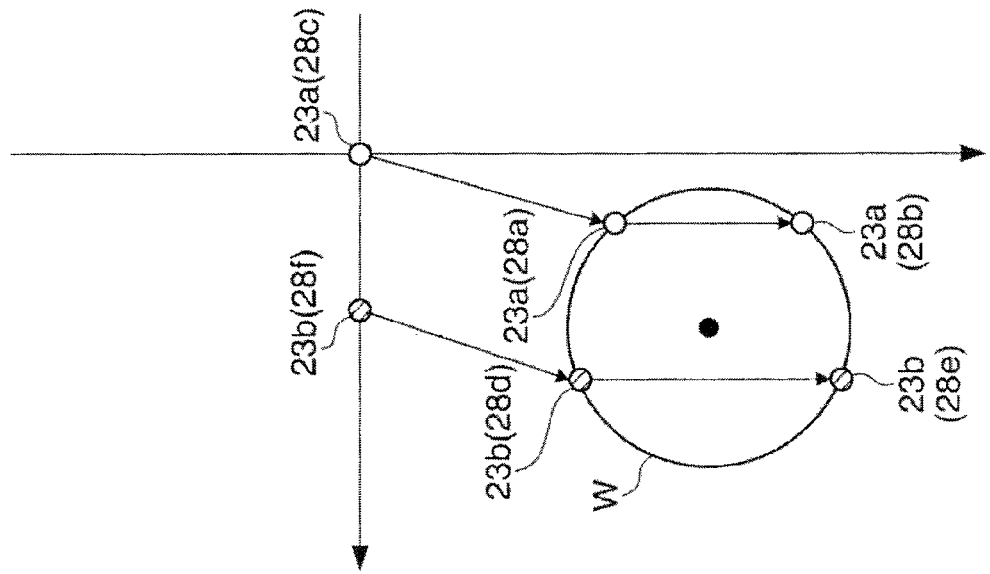
FIGS. 10A and 10B are views for explaining a relative movement of a wafer and a position sensor in a third exemplary embodiment of the present disclosure.
Figure 10A:
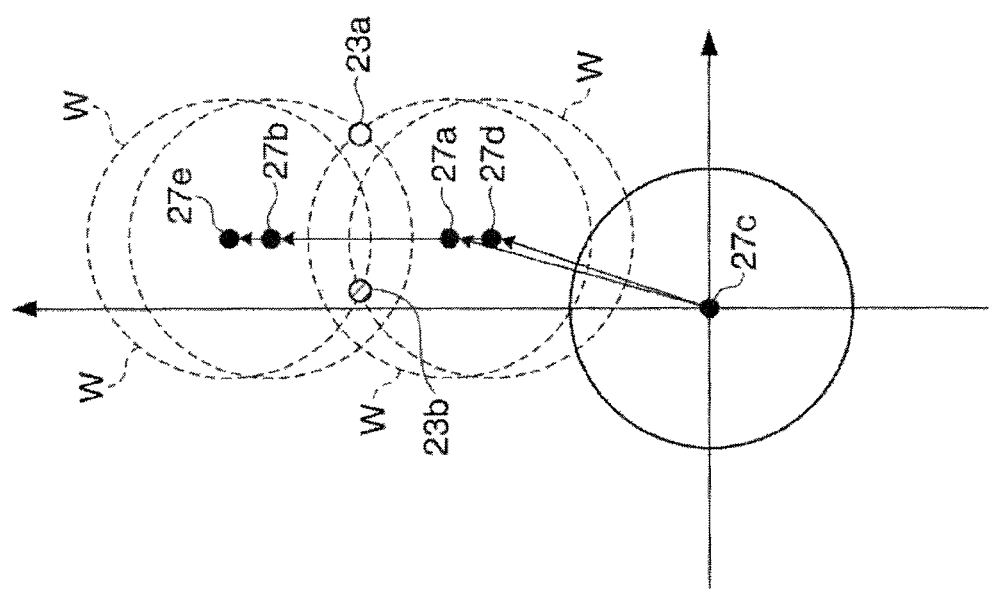

As illustrated in FIG. 10A, as in the second exemplary embodiment, in a conveyance robot coordinate system, when the conveyance robot 16 conveys a wafer W, the wafer W is moved with respect to the right sensor 23a and the left sensor 23b, the right sensor 23a detects the passage of the right edge of the wafer W twice, and the left sensor 23b detects the passage of the left edge of the wafer W twice. Meanwhile, in the first wafer coordinate system, as illustrated in FIG. 10B, the movement of the wafer W with respect to the right sensor 23a is converted into the movement of the right sensor 23a with respect to the wafer W, and the right sensor 23a detects intersection between the right sensor 23a and the right edge of the wafer W twice. Also, in the second wafer coordinate system, the movement of the wafer W with respect to the left sensor 23b is converted into the movement of the left sensor 23b with respect to the wafer W, and the left sensor 23b detects intersection between the left sensor 23b and the left edge of the wafer W twice.

Here, when the second wafer coordinate system is integrated with the first wafer coordinate system, an edge passage detection point 27a in the conveyance robot coordinate system corresponds to an edge intersecting point 28a where the right sensor 23a firstly intersects with the right edge of the wafer in the first wafer coordinate system, and an edge passage detection point 27b in the conveyance robot coordinate system corresponds to an edge intersecting point 28b where the right sensor 23a secondly intersects with the right edge of the wafer in the first wafer coordinate system. Also, in the conveyance robot coordinate system, an edge passage detection point 27d when the passage of the left edge of the wafer W is firstly detected by the left sensor 23b corresponds to an edge intersecting point 28d where the left sensor 23b firstly intersects with the left edge of the wafer in the first wafer coordinate system, and, in the conveyance robot coordinate system, an edge passage detection point 27e when the passage of the left edge of the wafer W is secondly detected by the left sensor 23b corresponds to an edge intersecting point 28e where the left sensor 23b secondly intersects with the left edge of the wafer in the first wafer coordinate system.

Also, as described in the second exemplary embodiment, an inverse vector of a motion vector from an origin 27c to the edge passage detection points 27a and 27b in the conveyance robot coordinate system corresponds to a motion vector from an origin 28c of the right sensor 23a to the edge intersecting points 28a and 28b in the first wafer coordinate system. Likewise, an inverse vector of a motion vector from the origin 27c to the edge passage detection points 27d and 27e in the conveyance robot coordinate system corresponds to a motion vector from an origin 28f of the left sensor 23b to the edge intersecting points 28d and 28e in the first wafer coordinate system.

When the centroid position of the fork 22 is coincident with the central position of the wafer W, the coordinates of the edge passage detection points 27a, 27b, 27d, and 27e in the conveyance robot coordinate system may be calculated from encoder values of three motors of the conveyance robot 16. Thus, the coordinates of the edge intersecting points 28a, 28b, 28d, and 28e may be calculated in the first wafer coordinate system. Therefore, in the present exemplary embodiment, the central position of the wafer W is calculated from the coordinates of the edge intersecting points 28a, 28b, 28d, and 28e in the first wafer coordinate system.

Meanwhile, when coordinates of three points are geometrically defined, a circle passing through the three points may be defined. Accordingly, in the present exemplary embodiment as well, in order to calculate the central position of the wafer W, at least three edge intersecting points may be selected from the four edge intersecting points 28a, 28b, 28d, and 28e. Therefore, in the present exemplary embodiment, with respect to two edge intersecting points among the four edge intersecting points 28a, 28b, 28d, and 28e, an edge intersecting point used for calculating a central position of the wafer W (hereinafter, referred to as an "effective edge intersecting point") is selected from the two remaining edge intersecting points.

Figure 11A:
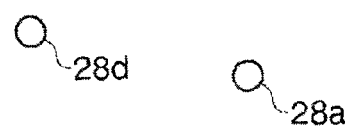
FIGS. 11A to 11C are views for explaining a method of selecting an edge intersecting point in the present exemplary embodiment.
Figure 11B:
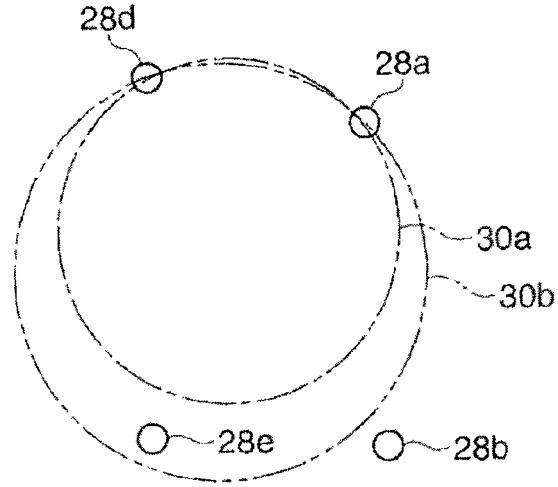
Figure 11C:
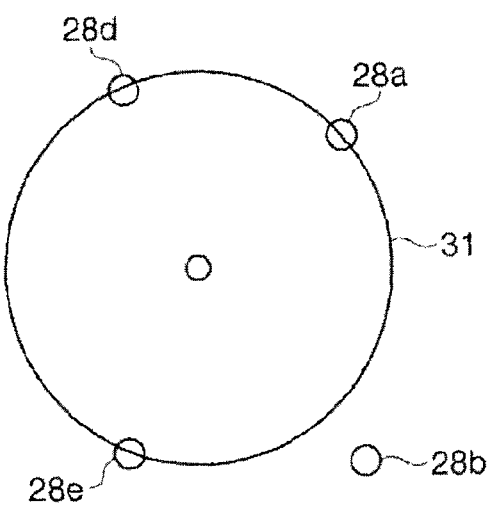

FIGS. 11A to 11C are views for explaining a method of selecting an edge intersecting point in the present exemplary embodiment.

First, the edge intersecting points 28a, 28b, 28d, and 28e in the first wafer coordinate system are acquired (FIG. 11A), and two edge intersecting points as a reference, for example, the edge intersecting points 28a and 28d, are selected as reference edge intersecting points from their coordinates, and two circles 30a and 30b passing through the selected edge intersecting points 28a and 28d and having different diameters are defined. The diameters of the two circles 30a and 30b are set in advance by the users of the plasma processing apparatus 10. Also, in the present exemplary embodiment, the diameter of the circle 30b is set to be larger than that of the circle 30a.

After the two circles 30a and 30b are defined, an edge intersecting point present within an area surrounded by the two circles 30a and 30b is selected as an effective edge intersecting point, between the two remaining edge intersecting points 28b and 28e. FIG. 11B illustrates a case where only the edge intersecting point 28e is selected as an effective edge intersecting point.

Then, a circle 31 that passes through the edge intersecting points 28a, 28d, and 28e selected as the reference edge intersecting points and the effective edge intersecting point is defined, and the central position of the circle 31 is acquired as a central position of the wafer W (substrate position during conveyance).

Figure 12:
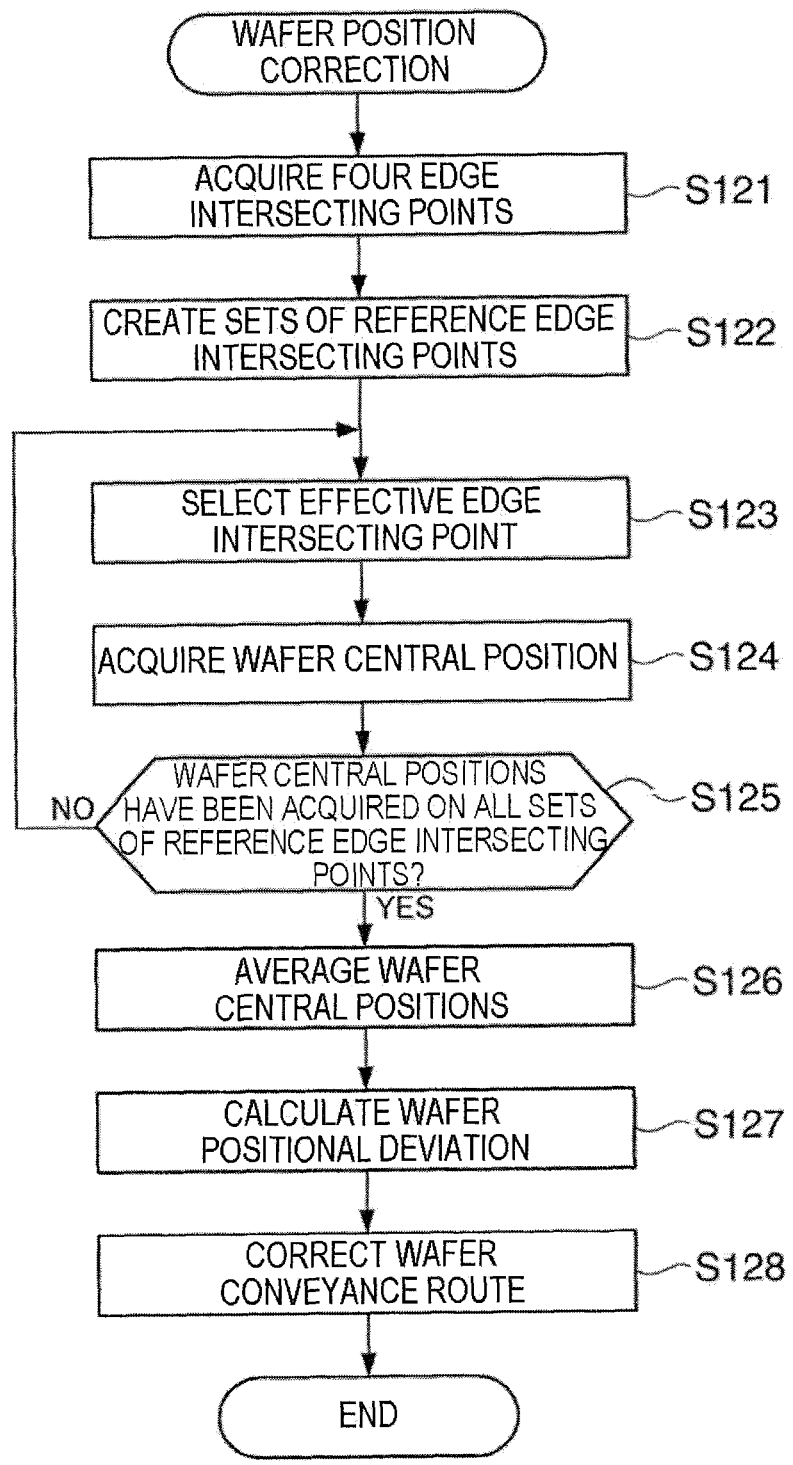
FIG. 12 is a flow chart illustrating a wafer position correction processing in a substrate conveyance method according to the present exemplary embodiment.

FIG. 12 is a flow chart illustrating a wafer position correction processing in a substrate conveyance method according to the present exemplary embodiment.

In the present exemplary embodiment as well, the processing of FIG. 12 is performed whenever the conveyance robot 16 conveys the wafer W to the substrate processing chamber 15. However, the processing of FIG. 12 is carried out on the assumption that the central position of the wafer W in the first wafer coordinate system has been acquired as the reference wafer position (reference substrate position) in advance. Also, as an acquisition method of the reference wafer position, the selection method of FIGS. 11A to 11C may be used.

First, four edge intersecting points 28a, 28b, 28d, and 28e in the first wafer coordinate system are acquired (step S121), and any two edge intersecting points are selected from these edge intersecting points to create a reference edge intersecting point set. Here, four reference edge intersecting point sets each of which is composed of two adjacent edge intersecting points among the four edge intersecting points 28a, 28b, 28d, and 28e (specifically, a set of the edge intersecting points 28a and 28b, a set of the edge intersecting points 28b and 28e, a set of the edge intersecting points 28e and 28d, and a set of the edge intersecting points 28d and 28a) are created (step S122).

Then, two circles passing through two edge intersecting points that constitute, for example, a set of edge intersecting points 28a and 28b, and having different diameters are defined. After the two circles are defined, between the two remaining edge intersecting points 28e and 28d that do not constitute the set of the edge intersecting points 28a and 28b, an edge intersecting point present within an area surrounded by the defined two circles is selected as an effective edge intersecting point (step S123). Then, a circle passing through a total of three edge intersecting points selected as the reference edge intersecting points and the effective edge intersecting point is defined, and the central position of the circle is acquired as a central position of the wafer W (step S124). When two edge intersecting points are selected as effective edge intersecting points, each of the two effective edge intersecting points is combined with the two reference edge intersecting points. Here, two combinations of edge intersecting points, each combination being composed of three edge intersecting points, are created. In each of the two combinations of edge intersecting points, a circle passing through three edge intersecting points is defined, and the central position of the circle is acquired as a central position of the wafer W.

Then, it is determined whether central positions of the wafer W have been acquired on all reference edge intersecting point sets created in step S122. When it is determined that a reference edge intersecting point set, on which the central position of the wafer W has not been acquired, is present, the process returns to step S123. When it is determined that the central positions of the wafer W have been acquired on all reference edge intersecting point sets, the plurality of central positions of the wafer W acquired by repetition of step S124 are averaged (step S126).

Then, a difference between the reference wafer position and the averaged wafer central position is calculated as a positional deviation for correction (δ) (step S127), and the conveyance route of the wafer W is corrected based on the calculated positional deviation for correction (δ) (step S128). Then, after the wafer W is conveyed to the corrected target position 33b, the processing is finished.

According to the processing of FIG. 12, when the edge of the wafer W passes above the right sensor 23a and the left sensor 23b disposed on the conveyance route of the wafer W to the substrate processing chamber 15, four edge intersecting points 28a, 28b, 28d, and 28e in the first wafer coordinate system are acquired, and a circle passing through three edge intersecting points selected from the four edge intersecting points 28a, 28b, 28d, and 28e is defined. The central position of the circle is acquired as a central position of the wafer W. That is, when the wafer W is conveyed to the substrate processing chamber 15, since the central position of the wafer W is acquired using the two right and left sensors 23a and 23b disposed on the conveyance route of the wafer W, it is possible to eliminate the need to acquire a central position of the wafer W using a position sensor disposed at a position away from the substrate processing chamber 15. Thus, a predetermined time is not required until the wafer W is moved to the substrate processing chamber 15 after the wafer central position is acquired.

As in the first exemplary embodiment, the conveyance route of the wafer W is corrected after the wafer W passes above the two right and left sensors 23a and 23b. The correction of the conveyance route of the wafer W is performed spending all of a predetermined correction time regardless of the magnitude of the positional deviation for correction (δ) after the wafer W passes above the pair of sensors 23 and the positional deviation for correction (δ) is acquired. Thus, as in the first exemplary embodiment, it is possible to reduce the correction amount of the conveyance route per unit time, thereby suppressing the pathway of the wafer W in the conveyance route from being largely changed.

Accordingly, the conveyance throughput of the wafer W may be improved and a further deviation of the wafer W may be suppressed from occurring during the conveyance of the wafer W.

Also, in the processing of FIG. 9, between the two remaining edge intersecting points that do not constitute a reference edge intersecting point set, an edge intersecting point present within an area surrounded by two circles defined based on two edge intersecting points that constitute the reference edge intersecting point set is also selected as an effective edge intersecting point. Thus, after an edge intersecting point present at an abnormal position is excluded, the central position of the wafer W may be acquired. Therefore, the reliability of the acquired central position of the wafer W may be improved.

Also, in the processing of FIG. 9, a wafer central position is calculated by averaging a plurality of central positions of the wafer W that have been acquired on all reference edge intersecting point sets, and the positional deviation for correction (δ) is calculated based on the averaged wafer central position. Accordingly, the reliability of the positional deviation for correction (δ) may be improved, and further, the correction reliability of the conveyance route of the wafer W may be improved.

Also, in the processing of FIG. 9, when the central position of the wafer W is acquired, the radius r of the wafer W is not required. Thus, a variation of the radius r of the conveyed wafer W does not have an influence on the acquired central position of the wafer W. This may also improve the reliability of the positional deviation for correction (δ) calculated based on the wafer central position.

In the processing of FIG. 9 as described above, the central position of the wafer W is acquired using a reference edge intersecting point set composed of two adjacent edge intersecting points. Meanwhile, the central position of the wafer W may be acquired using an edge intersecting point set composed of three edge intersecting points.

FIGS. 13A to 13D are views for explaining a modified example of a method of acquiring a central position of a wafer in the present exemplary embodiment.

Figure 13A:
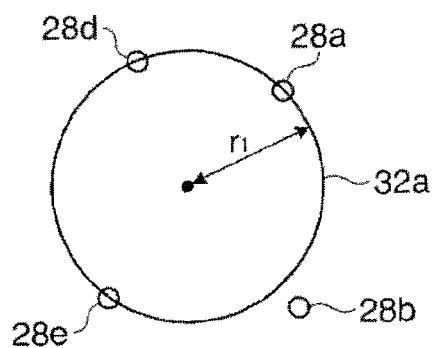
FIGS. 13A to 13D are views for explaining a modified example of a method of acquiring a central position of a wafer in the present exemplary embodiment.
Figure 13B:
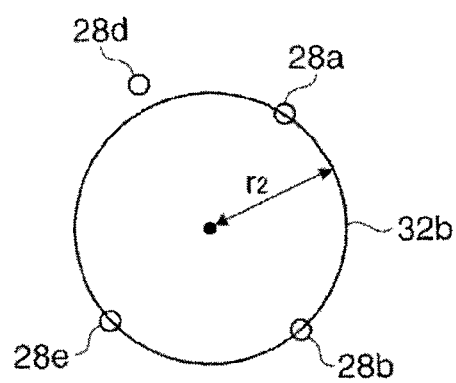

First, edge intersecting points 28a, 28b, 28d and 28e in the first wafer coordinate system are acquired, a circle 32a passing through the three edge intersecting points 28a, 28e, and 28d is defined, and a radius $r_1$ of the circle 32a is acquired (FIG. 13A). Then, a circle 32b passing through the three edge intersecting points 28a, 28b, and 28e is defined, and a radius $r_2$ of the circle 32b is acquired (FIG. 13B).

Figure 13C:
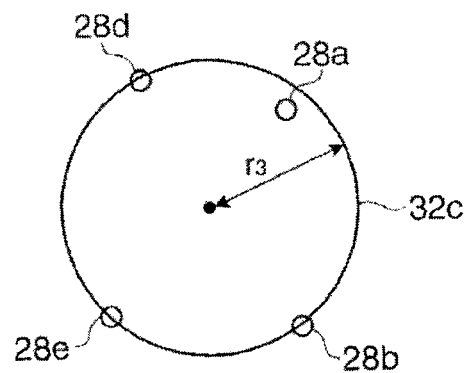
Figure 13D:
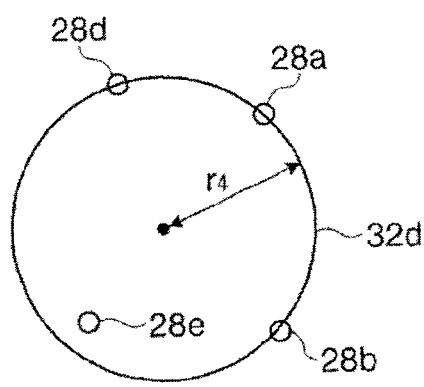

Then, a circle 32c passing through the three edge intersecting points 28b, 28e, and 28d is defined, and a radius $r_3$ of the circle 32c is acquired (FIG. 13C). Then, a circle 32d passing through the three edge intersecting points 28a, 28b, and 28d is defined, and a radius $r_4$ of the circle 32d is acquired (FIG. 13D). Then, a circle having a radius most close to a radius r of the wafer W is selected from the circles 32a to 32d, and the central position of the selected circle is acquired as a central position of the wafer W.

The acquisition method of the radius $r_1$ to $r_4$ of the circles 32a to 32d is as follows. For example, in the following equation (1) as the equation of the circle 32a in the first wafer coordinate system, $$X^2+Y^2+lX+mY+n=0 \qquad (1)$$

when coordinates of the edge intersecting points 28a, 28e, and 28d in the first wafer coordinate system are set as (X1, Y1), (X2, Y2), and (X3, Y3), respectively, the equation (1) may be expressed as the following equation (2) using a matrix A and a matrix B.

$$A \begin{bmatrix} l \\ m \\ n \end{bmatrix} = B, A = \begin{bmatrix} X1 & Y1 & 1 \\ X2 & Y2 & 1 \\ X3 & Y3 & 1 \end{bmatrix}, B = - \begin{bmatrix} X1^2 + Y1^2 \\ X2^2 + Y2^2 \\ X3^2 + Y3^2 \end{bmatrix} \qquad (2)$$

When the inverse matrix $A^{-1}$ of the matrix A from the left side in the equation (2) is multiplied, the following equation (3) is obtained. From the inverse matrix $A^{-1}$ and the matrix B, that is, coordinates of the respective edge intersecting points 28a, 28e, and 28d, coefficients (l, m, and n) of the equation (1) may be obtained.

$$\begin{bmatrix} l \\ m \\ n \end{bmatrix} = A^{-1} B \qquad (3)$$

Accordingly, the circle 32a may be defined, and the radius $r_1$ of the circle 32a may be acquired. The radius ($r_2$ to $r_4$) of the circles 32b to 32d may also be acquired.

In the modified example of the acquisition method of the central position of a wafer in FIGS. 13A to 13D, among the circles 32a to 32d defined by three edge intersecting points selected from the four edge intersecting points 28a, 28b, 28d, and 28e, the central position of the circle having a radius most close to a radius r of the wafer W is acquired as a central position of the wafer W. Thus, when the central position of the wafer W is acquired, an edge intersecting point present at an abnormal position may be excluded. Therefore, the reliability of the acquired central position of the wafer W may be improved.

So far, the present disclosure has been described with reference to respective exemplary embodiments, but is not limited to the exemplary embodiments described above.

An object of the present disclosure is achieved by supplying a storage medium in which program codes of software for realizing functions of the above described respective exemplary embodiments are stored to a computer (not illustrated) provided in, for example, the controller 17, and reading and executing the program codes stored in the storage medium by a CPU of the computer.

In this case, the program codes themselves read from the storage medium realize the functions of the respective exemplary embodiments described above, and the program codes and the storage medium having the program codes stored therein constitute the present disclosure.

As a storage medium for supplying program codes, any medium such as, for example, an RAM, an NV-RAM, a floppy disk (registered mark), a hard disk, a magneto-optical disk, an optical disk (e.g., a CD-ROM, a CD-R, a CD-RW, a DVD (DVD-ROM, DVD-RAM, DVD-RW, DVD+RW)), a magnetic tape, a nonvolatile memory card, or another ROM may be used as long as it can store the program codes. Otherwise, the program codes may be downloaded from, for example, a database or another computer (not illustrated) connected to, for example, Internet, a commercial network or a local area network, and supplied to the computer.

Also, the present disclosure also includes a case where the functions of the respective exemplary embodiments described above are realized when the program codes read by the computer are executed, and based on the instructions of the program codes, for example, an operating system (OS) running on the CPU performs a part or whole of actual processings, and the functions of the respective exemplary embodiments described above are realized by the processings.

Also, the present disclosure also includes a case where, after the program codes read from the storage medium are recorded in a memory provided in a function expansion board inserted in the computer or a function expansion unit connected to the computer, for example, a CPU provided in the function expansion board or the function expansion unit performs a part or whole of the actual processings based on the instructions of the program codes, and the functions of the respective exemplary embodiments described above are realized by the processings.

The form of the program codes may be, for example, an object code, a program code executed by an interpreter, and script data supplied to an OS.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for conveying a disk-shaped substrate to a substrate processing chamber by a conveyance unit, the method comprising:
    acquiring, in advance, a reference substrate position as a reference of a position of the substrate when the substrate is conveyed;
    acquiring a conveyance substrate position which is a position of the substrate conveyed to the substrate processing chamber;
    calculating a positional deviation of the conveyance substrate position with respect to the reference substrate position;
    correcting a pathway of the substrate to the substrate processing chamber to eliminate the calculated positional deviation; and
    conveying the substrate to the substrate processing chamber based on the corrected pathway of the substrate,
    wherein the acquiring the conveyance substrate position includes:
        disposing two position sensors in a conveyance route of the substrate such that the two position sensors are spaced apart from each other at an interval smaller than a diameter of the substrate, and face the substrate;

acquiring four intersecting points where the two position sensors intersect with an outer edge of the substrate while the substrate is conveyed to the substrate processing chamber;

selecting two intersecting points among the four intersecting points as reference intersecting points;

defining two circles passing through the two reference intersecting points and having different diameters; and selecting an intersecting point present within an area surrounded by the two circles, between two intersecting points unselected as the reference intersecting points from the four intersecting points, and acquiring the conveyance substrate position based on the selected intersecting points and the two reference intersecting points.

2. The method of claim 1, wherein the acquiring the conveyance substrate position, the calculating the positional deviation, and the correcting the pathway of the substrate are performed when the substrate is conveyed.

3. The method of claim 1, wherein the acquiring the conveyance substrate position, the calculating the positional deviation, and the correcting the pathway of the substrate are performed at a time when aged deterioration of the conveyance unit is expected.

4. The method of claim 1, wherein at a time when the position sensors are exchanged, the acquiring the conveyance substrate position, the calculating the positional deviation, and the correcting the pathway of the substrate are performed.

5. A method for conveying a disk-shaped substrate to a substrate processing chamber by a conveyance unit, the method comprising:

acquiring, in advance, a reference substrate position as a reference of a position of the substrate when the substrate is conveyed;

acquiring a conveyance substrate position which is a position of the substrate conveyed to the substrate processing chamber;

calculating a positional deviation of the conveyance substrate position with respect to the reference substrate position;

correcting a pathway of the substrate to the substrate processing chamber to eliminate the calculated positional deviation; and conveying the substrate to the substrate processing chamber based on the corrected pathway of the substrate, wherein the acquiring the conveyance substrate position includes:

disposing two position sensors in a conveyance route of the substrate such that the two position sensors are spaced apart from each other at an interval smaller than a diameter of the substrate, and face the conveyed substrate;

acquiring four intersecting points where the two position sensors intersect with an outer edge of the substrate while the substrate is conveyed to the substrate processing chamber;

creating a plurality of combinations of intersecting points, each combination being composed of three intersecting points, from the four intersecting points;

defining circles each of which passes through the three intersecting points in each of the combinations; and acquiring the conveyance substrate position based on a circle having a diameter most close to the diameter of the conveyed substrate among the defined circles.

6. A method for conveying a disk-shaped substrate to a substrate processing chamber by a conveyance unit, the method comprising:

acquiring, in advance, a reference substrate position as a reference of a position of the substrate when the substrate is conveyed;

acquiring a conveyance substrate position which is a position of the substrate conveyed to the substrate processing chamber;

calculating a positional deviation of the conveyance substrate position with respect to the reference substrate position;

correcting a pathway of the substrate to the substrate processing chamber to eliminate the calculated positional deviation; and conveying the substrate to the substrate processing chamber based on the corrected pathway of the substrate, wherein the acquiring the conveyance substrate position includes:

disposing a position sensor in a conveyance route of the substrate such that the position sensor faces the conveyed substrate;

acquiring two intersecting points among four intersecting points where the position sensor intersects with an outer edge of the substrate while the substrate is conveyed to the substrate processing chamber; and geometrically acquiring the conveyance substrate position based on the two intersecting points and a radius of the conveyed substrate.

7. The method of claim 6, wherein the acquiring the conveyance substrate position includes:

disposing a different position sensor in the conveyance route of the substrate such that the position sensor faces the conveyed substrate;

acquiring two other intersecting points where the position sensor intersects with the outer edge of the substrate;

geometrically acquiring a different conveyance substrate position which is a position of the substrate conveyed to the substrate processing chamber based on the two other intersecting points and the radius of the conveyed substrate;

calculating an average substrate position by averaging the conveyance substrate position and the different conveyance substrate position; and calculating a positional deviation of the average substrate position with respect to the reference substrate position.

* * * * *